United States Patent
Chen et al.

(10) Patent No.: US 7,499,308 B2
(45) Date of Patent: Mar. 3, 2009

(54) PROGRAMMABLE HEAVY-ION SENSING DEVICE FOR ACCELERATED DRAM SOFT ERROR DETECTION

(75) Inventors: Howard H. Chen, Yorktown Heights, NY (US); John A. Fifield, Underhill, VT (US); Louis L. Hsu, Fishkill, NY (US); Henry H. K. Tang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/689,096

(22) Filed: Mar. 21, 2007

(65) Prior Publication Data
US 2008/0273393 A1    Nov. 6, 2008

(51) Int. Cl.
*G11C 7/00*    (2006.01)

(52) U.S. Cl. ........................................ 365/149; 365/205

(58) Field of Classification Search ................. 365/149, 365/205
See application file for complete search history.

(56) References Cited

U.S. PATENT DOCUMENTS

| | | | |
|---|---|---|---|
| 4,983,843 A | | 1/1991 | Thomson |
| 5,134,616 A | * | 7/1992 | Barth et al. ................. 714/711 |
| 5,657,267 A | * | 8/1997 | Levi ........................... 365/149 |
| 6,583,470 B1 | | 6/2003 | Maki et al. |
| 6,785,169 B1 | | 8/2004 | Nemati et al. |
| 7,193,887 B2 | * | 3/2007 | Wood ......................... 365/154 |
| 2005/0259462 A1 | * | 11/2005 | Wood ......................... 365/154 |

* cited by examiner

*Primary Examiner*—Michael T Tran
(74) *Attorney, Agent, or Firm*—Brian P. Verminski

(57) ABSTRACT

Aspects of the invention relate to a programmable heavy-ion sensing device for accelerated DRAM soft error detection. Design of a DRAM-based alpha particle sensing apparatus is preferred to be used as an accelerated on-chip SER test vehicle. The sensing apparatus is provided with programmable sensing margin, refresh rate, and supply voltage to achieve various degree of SER sensitivity. In addition, a dual-mode DRAM array is proposed so that at least a portion of the array can be used to monitor high-energy particle activities during soft-error detection (SED) mode.

6 Claims, 4 Drawing Sheets

PROGRAMMABLE HEAVY-ION SENSING DEVICE FOR ACCELERATED DRAM SOFT ERROR DETECTION

BACKGROUND OF THE INVENTION

1. Field of the Invention

Aspects of the invention generally relate to error detection in semiconductor devices, more specifically to a programmable heavy-ion sensing device for accelerated (DRAM) soft error detection in semiconductor devices.

2. Description of Related Art

Alpha particles are helium (He) nuclei that comprise two protons and two neutrons. Alpha particles, which are often emitted from larger atoms as a result of radioactive decay, can penetrate the die surface of an electronic device, creating a cloud of electron-hole pairs along the track of alpha particles. An alpha particle emitted from the integrated circuit (IC) materials such as $^{210}$Pb has about 5.3 MeV of energy, and can travel about 25 um into the silicon. As a result, dynamic random access memory (DRAM) storage regions such as potential wells can collect sufficient number of minority carriers to change the stored state of a memory cell. Diffusion regions and sense amplifiers are also sensitive to the penetrating alpha particles.

The sensitivity of electronic devices to radiation can be described in terms of the soft-error rate (SER) measured in number of failures per bit-hour. SER generally refers to the transient single-cell upsets caused by the penetration of high-energy particles, because the carriers generated by these particles can cause individual bits to be upset. The soft errors may result in loss of data, but will not cause physical damage to the device. Although soft errors can be reset or reprogrammed, a temporary loss of data nevertheless may have a serious consequence to the system operation. For terrestrial systems, there are two common radiation mechanisms that cause SER reliability problems: the alpha-particles from radioactive contaminants in the chip and the package material, and cosmic rays. Many memory chips need to specify their estimated alpha-particle SER, based on the alpha-particle fluxes from ceramic packages and lead-based connectors. The soft errors caused by alpha particles may be controlled by the use of purified materials, while the soft errors caused by cosmic rays can be mitigated with robust chip design.

Both dynamic and static memory are volatile, but dynamic memory can lose its memory state, even with the power on, so it must be refreshed periodically. A traditional static memory cell is composed of 6 transistors, including a cross-coupled pair that toggles between the 2 states. A dynamic memory cell, on the other hand, consists of a single transistor and a storage capacitor, where a bit-line connects to the source of the transistor, and a word-line connects to the gate. The drain of the transistor device is connected directly to a planar capacitor formed by poly-silicon and oxide layers over the silicon. The state of the memory cell is determined by the presence or absence of charge on the storage node. Since the charge stored on the node of a dynamic memory cell is susceptible to leakage, it must be refreshed periodically. The refresh cycle is determined by the time it takes the charge stored in the cell to deplete to a minimal level needed for a memory cell to hold its information in the presence of alpha particles.

Three different memory cell technologies for storing the bit charge have evolved since the introduction of the 16 Mb DRAM chip: (1) the stacked capacitor with high-k dielectric layers, (2) a trench capacitor with the stored charge insulated from the substrate, and (3) a trench capacitor using p/n junction to isolate the stored charge from the substrate material. In order to maintain node capacity while reducing cell size, modern DRAM chips use 3-dimensional structures such as vertical transistors and capacitors with high-k dielectric, because smaller node capacitance often requires higher refresh rate to prevent soft-error problems. As the DRAM chip increases its size to 1 Gb, its sensitivity to radiation has also improved due to the significant reduction in DRAM volume per cell and the newer cell designs that eliminate the funneling of charge from the substrate. Since the new design has no charge stored in the silicon substrate and there is little leakage, the chip is more immune to alpha-particle hits and less susceptible to soft errors.

The single-event upset (SEU) at the chip level can be evaluated with accelerated testing by irradiating the chip with mono-energetic beams of subatomic particles. The most commonly used particles for SEU testing are heavy ions, protons and neutrons. Other particles such as electrons and high-energy photons can also be used for space applications, but they produce less ionization effects than heavy ions, protons, and neutrons. The main objective of a heavy ion test is to measure the SEU cross-section curve, which is an intrinsic characterization of the SEU sensitivity of a circuit. For heavy ions, the SEU cross section is a function of the linear energy transfer (LET), which is the average energy loss of the ion per unit track length. For protons or neutrons, the SEU cross section is a function of the particle energy. In addition, the SEU cross section is a function of device operating conditions such as supply voltage and junction temperature.

For a given particle species, the SEU cross section is defined as $\sigma_{SEU}(E)$=number of failures detected per particle fluence per number of bits, where E is the energy of the particle and particle fluence is the number of particles per unit area impinging on the test circuit. A heavy ion often refers to any ion with more than one proton in the nucleus, which includes alpha particle (a helium ion) or other heavier ions. A heavy ion causes SER due to the ionization energy deposited on a sensitive device region. This ionization energy is associated with the production of electron-hole pairs near the track of the intruding particle. Protons are also ionizing particles, which can initiate spallation reactions with semiconductor materials and cause SEU. Neutrons, on the other hand, do not cause direct ionization. When a high-energy neutron collides with a nucleus in the material around a sensitive node, a nuclear spallation reaction is initiated, which produces secondary charged fragments such as alpha particles and recoil nuclei. These secondary charged fragments hit the sensitive node and cause SEU.

Whereas the SEU cross section is an intrinsic parameter that characterizes the SEU sensitivity of a circuit, the failure-in-time (FIT) rate, or the number of failures per unit time, varies from location to location. For instance, the FIT rate due to neutrons is given by $F=\int dE \, d\phi(E)/dE \, \sigma_{SEU}(E)$, where $d\phi(E)/dE$ is the neutron energy differential flux in neutron number per (cm$^2$-MeV-s)), $\sigma_{SEU}$ is the neutron-induced SEU cross section, and E is the neutron energy. FIT rate due to terrestrial neutrons from cosmic rays can be computed accurately from the equation above, because $\sigma_{SEU}$ can be measured, and neutron energy flux $d\phi(E)/dE$ at any location can be computed by an accurate parametric model that takes into account of the earth's altitude and geomagnetic effects.

In space programs that involve satellites or flight missions in high orbits, high-energy protons and heavy ions are the particles that cause SEUs. The failure rate due to high-energy protons can be computed by the equation above, where $d\phi/dE$, $\sigma_{SEU}$, and E are the particle flux, cross section and energy associated with the protons. The proton flux $d\phi(E)/dE$ can be estimated by a common simulation code.

Life testing can be done by measuring the soft errors of a tester that contains hundreds of product chips, which are exposed to environmental radiation. The measurements are done under nominal operating conditions of the chips at various test locations. Although life testing provides the most realistic estimates of soft error rates, it often takes months to collect the data, which makes it difficult to use life testing as a means to predict hidden SEU problems in new technologies.

Alternatively, SEU modeling at the device and circuit level provides an important and effective evaluation that allows an engineer to discover weak spots in the early stage of design cycle. Most chips with anomalously high SEUs have been shown to suffer from weak spots such as floating bit-lines, insufficient margins on sense-amplifiers, and junctions exposed to the silicon substrate.

In U.S. Pat. No. 4,983,843, entitled "Radon detector," a radon gas detector instrument that uses a DRAM as an alpha particle detector is described. A DRAM array devoid of an alpha particle barrier layer is constructed with no surface polyimide or other alpha-particle blocking layer to enhance the DRAM soft error rate. In addition, the DRAM refresh rate is extended to allow enough time for a particle count to be established. The DRAM is prepared for sensing by relaxing and storing "1"s in every cell. After exposing the DRAM to alpha particles and waiting a period of time for cells of the DRAM to become charged by the alpha particles, one can read the DRAM array to determine the number of charged cells in the DRAM. Since there is no provision to accelerate the detection of SER, it will take a significant period of time to collect the information. Furthermore, due to the difficulty of predicting defect-driven cell leakage, an extended refresh interval for one DRAM chip may not produce consistent SER sensitivity among a group of chips.

In U.S. Pat. No. 6,583,470, entitled "Radiation tolerant back biased CMOS VLSI," a CMOS circuit is implemented with improved immunity to total ionizing dose radiation, radiation-induced latch up, and a single-event upset, by controlling the p-well voltage and the effective threshold voltage of the n-channel transistors, or controlling the n-well voltage and the effective threshold voltage of the p-channel transistors. Furthermore, by using the p+ and n+ guards, as well as back biasing, radiation-induced single event upsets and total ionizing dose effects can be minimized.

In U.S. Pat. No. 6,785,169, entitled "Memory cell error recovery," the soft error rate in a semiconductor memory is improved via the use of a circuit adaptively arranged with a mirror bit to recover from a soft error. The first and mirror memory cells are configured and arranged to receive and store a same bit in response to a write operation, with the memory cells more susceptible to a bit error. For a read operation, the bits stored at the first and second memory cells are compared. If the bits are the same, the bit from the first or mirror bit is read out. If the bits are different, a bit corresponding to the more susceptible state is read out to overcome the soft errors. Although the proposed method provides a means to recover from the soft errors, it does not teach how to design a memory array to speed up the detection of soft errors.

SUMMARY OF THE INVENTION

Aspects of the invention relate to a programmable heavy-ion sensing device for accelerated DRAM soft error detection. Design of a DRAM-based alpha particle sensing apparatus is preferred to be used as an accelerated on-chip SER test vehicle. The sensing apparatus is provided with programmable sensing margin, refresh rate, and supply voltage to achieve various degree of SER sensitivity. In addition, a dual-mode DRAM array is proposed so that at least a portion of the array can be used to monitor high-energy particle activities during soft-error detection (SED) mode. The same memory array can be reset so that it has acceptable immunity to soft-error rate (SER) during normal operating mode. More specifically, the DRAM arrays can be tuned to have different levels of sensitivities to radiation-induced soft-error rates during SED period. Four methods to adjust the SER sensitivities during the SED mode are proposed: (1) adjusting the sensing margin of DRAM sense amplifiers through the tuning of the sense-reference voltage, (2) adjusting both the sensing margin and refresh rate, (3) lowering the DRAM array supply voltage, and (4) any combination of the above methods to adjust SER sensitivity during SED mode. Such memory arrays can fully occupy the entire chip to facilitate and accelerate the mapping of alpha particle activities across the chip. Such memory macros can also be strategically distributed and embedded in a system chip to monitor the alpha particle activities to investigate, characterize, and improve SER modeling capability.

In one aspect, a programmable sensing detector for accelerated soft error detection is provided that comprises: a diffusion area to collect radiation; a pre-charged ballast capacitor coupled to the diffusion area; and a sense amplifier coupled to the pre-charged ballast capacitor for detecting a Single Event Upset (SEU) based on the radiation collected in the diffusion area.

In another aspect, a method for DRAM soft error detection is provided that comprises: initializing a storage node to a first voltage at a predetermined refresh rate; detecting, with a sense amplifier coupled to the storage node, a Single Event Upset (SEU) event when the storage node has discharged to a second voltage; and generating an output signal from the sense amplifier indicating that the SEU event has occurred.

In another aspect, a Dynamic Random Access Memory (DRAM) array for detecting a Single Event Upset (SEU) event, comprising: a set of word decoders to drive word lines of a set of DRAM cells; a set of sense amplifiers coupled to the set of DRAM cells; and a bit decoder for multiplexing the set of sense amplifiers.

In another aspect of the present invention, a method for constructing a parameter matrix from mono-energetic ion beam measurements is provided that comprises: selecting an ion species $Zi(i=1, 2, \ldots, imax)$; selecting an ion energy $Ej(j=1, 2, \ldots, jmax)$; selecting an ion incident angle $\Theta k(k=1, 2, \ldots, kmax)$; computing an ion energy loss in a BEOL; computing an ion energy at a Si surface $Es(i,j,k)$; computing an ion LET at a Si surface $LETs(l,j,k)$; and computing a measured SEU cross section.

BRIEF DESCRIPTION OF THE DRAWINGS

The foregoing and other aspects of embodiments of this invention are made more evident in the following Detailed Description of Preferred Embodiments, when read in conjunction with the attached drawings, wherein.

Figure 1:
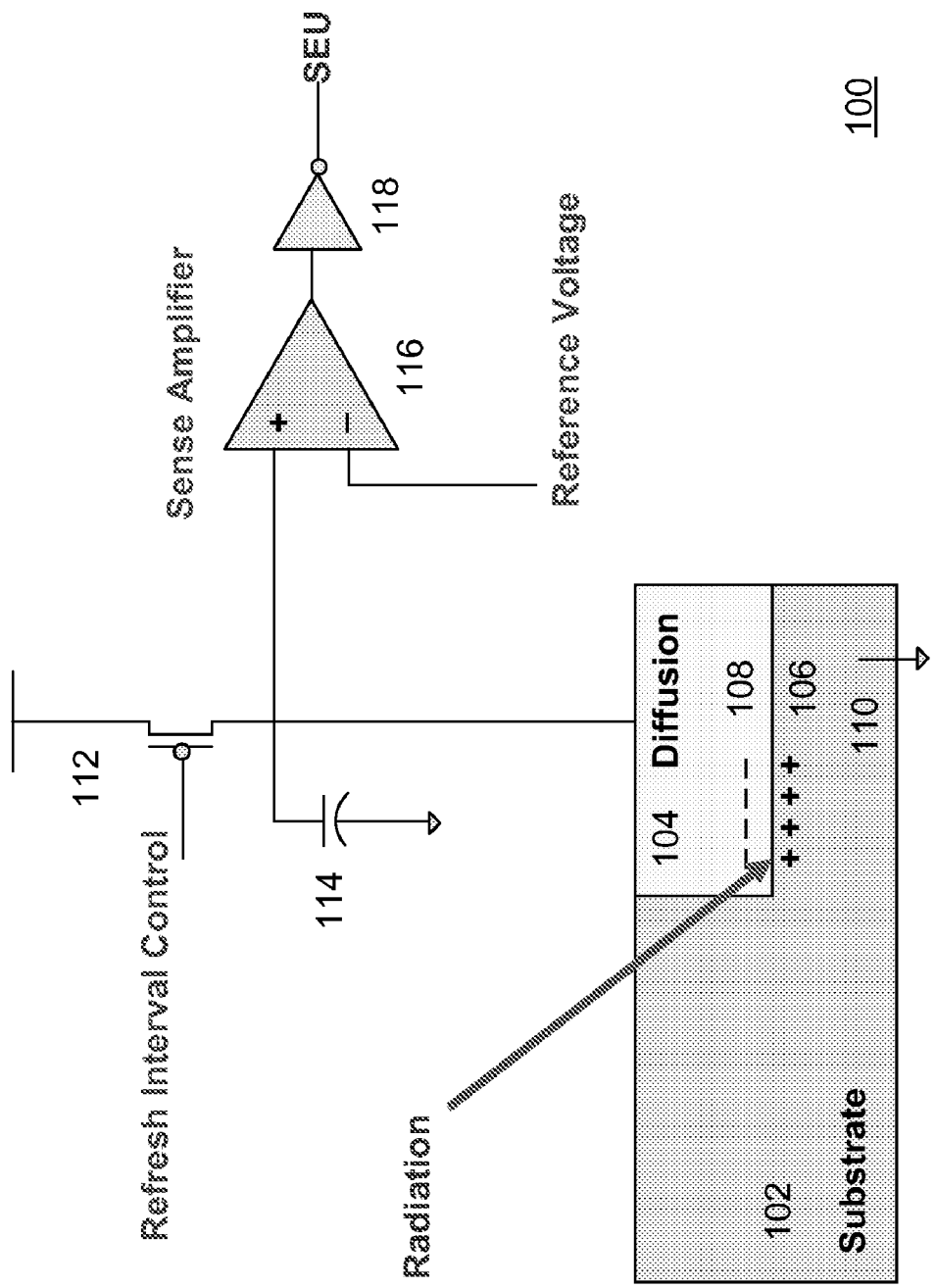
FIG. 1 shows an exemplary circuit schematic of a sense amplifier with adjustable reference voltage to accelerate soft error detection in accordance with an embodiment of the invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

For convenience, the Detailed Description of the Invention has the following sections:
I. Error Detection
II. Experimental Matrix Built From Mono-Energetic Ion Beam Measurements and Its Applications
  (1) Elements of Experimental Parameter Matrix
  (2) Projection of Alpha-Induced SEU Rate
  (3) Projection of Neutron-Induced SEU Rate
  (4) Calibrations of SEU Models of Device/Circuit with Experimental Hardware I. Error Detection An object of the present invention is to provide a single-event upset (SEU) detection device with adjustable sensitivity. Another object of the invention is to provide a means for detecting an SEU that is independent of defect and diffusion node leakage. The first embodiment of the invention describes the design of a heavy-ion sensing apparatus that accelerates soft error detection in DRAM by adjusting the reference voltage level of the sense amplifier closer to the first (pre-charge) voltage level. The reference voltage, which is set to a second voltage level, corresponds to the voltage level where an SEU radiation event is expected to discharge the storage node to. A soft-error monitor or single-event upset (SEU) detector 100, comprising a diffusion area 104 of substrate 102 to collect radiation, a pre-charged ballast capacitor 114, and a sense amplifier 116, is shown in FIG. 1. A radiation event is detected when the charge stored on the storage ballast capacitor 114 or the diffusion node 104 is neutralized by the carriers 106 and 108 generated by high-energy particles. The diffusion area 104 can be sized according to the statistical probability of receiving electron current from an SEU, as larger diffusion area allows greater probability of capturing an SEU. The diffusion area 104 can be made from one large diffusion region or, as in a traditional DRAM array, in the form of many source-drain diffusions within an array of storage cells. The ballast capacitor 114 can be fabricated from a gate-oxide capacitor with an effective oxide thickness preferably greater than 17 Å to prevent the gate tunneling currents from affecting the storage-node voltage. The ballast capacitor 114 can be directly coupled to pre-charge device 112 and sensing amplifier 116, or multiplexed through typical wordline access field-effect transistors (FETs) and bit-line isolation FETs to the pre-charge and sensing devices. Radiation region 110 represents the substrate region underneath the diffusion region subject to radiation. Output driver 118 is an output driver to buffer the analog output of the sense amp 116, into a full digital signal.

The pre-charge device 112 initializes the storage node to a first voltage at a predetermined refresh rate to compensate for expected diffusion-leakage current. The sensing device, which is coupled to the storage node, then detects the SEU event when the storage node has discharged to a second voltage level. The sense amplifier 116 subsequently generates an output signal, indicating that a radiation event has been detected. The sense amplifier 116 could be implemented with a latch circuit operating with a voltage reference input and an input from the storage node, or a singe-ended sense amplifier structure that has a common source NFET amplifier with an adjustable current source load provided by a PFET. A differential amplifier can also be used as a sense amplifier 116 to provide radiation detection output without the use of clocking circuits.

The reference voltage can be adjusted by digital control with the use of a digital-to-analog converter and a voltage regulator, or by direct application of an analog voltage. The restore device is activated by a restore interval control signal, at a rate calculated to prevent the normal diffusion leakage current from discharging the diffusion node down to the second reference voltage. A typical time interval could be 10 microseconds. In one arrangement, the voltage at diffusion node is assumed to be higher than the reference voltage, until an ionizing radiation event causes electrons generated from the hole-electron pairs to collect into the diffusion node. When the electrons collect at the diffusion node, the voltage drops below the reference voltage and flags a radiation event. For a soft error to occur at a specific node, the charge collected at that node must be greater than the critical charge to cause a bit to flip. The critical charge $Q_{critical}$ of a memory array storage cell is defined as the largest charge that can be injected without changing the cell's logic state. The sensitivity of the detector can be varied by adjusting the reference voltage, which directly modulates the critical charge level in a linear relationship. To detect a low-energy radiation event, the reference voltage is raised to be closer to the first pre-charge voltage.

In a DRAM array, data are stored as the presence or absence of charge carriers in storage wells. The amount of the charge in a well that has 3 million electrons is about 480 fC ($-1.6 \times 10-19$ coulomb/electron). The susceptibility of a memory device to soft errors depends primarily on $Q_{critical}$. When the charge of electrons generated by ionizing particles and collected by the storage well exceeds $Q_{critical}$, a soft error occurs. The ionizing particle can be a proton, an alpha particle, or a heavy ion whose atom is stripped of some of its electrons. If a DRAM array has a $Q_{critical}$ greater than 1200 fC, it will be unlikely for alpha particles emitted from IC materials to cause soft errors, because the energy deposited by these alpha particles generally does not produce enough electron-hole pairs. On the other hand, if $Q_{critical}$ is less than 24 fC, the alpha particles emitted from the packaging materials will very likely cause soft errors. Therefore, it is desirable to provide the capability of tuning the $Q_{critical}$ of a DRAM array so that it can be used to characterize the alpha particle or other type of radiations. Since the critical charge is proportional to the supply voltage and node capacitance, $Q_{critical}$ can be changed by increasing the supply voltage, reducing the dielectric thickness to increase capacitance, and changing the cell geometry such as storing charge on the inner walls of a deep trench or building DRAM on an SOI. As nanotechnology continues to scale down device size with lower supply voltage and smaller node capacitance, circuits are more prone to soft errors because less charge needs to be collected to cause a bit flip. For 90 nm technology and beyond, the critical charge in a logic node becomes small enough that a bit flip can occur after being struck be relatively low-LET particles.

Figure 2:
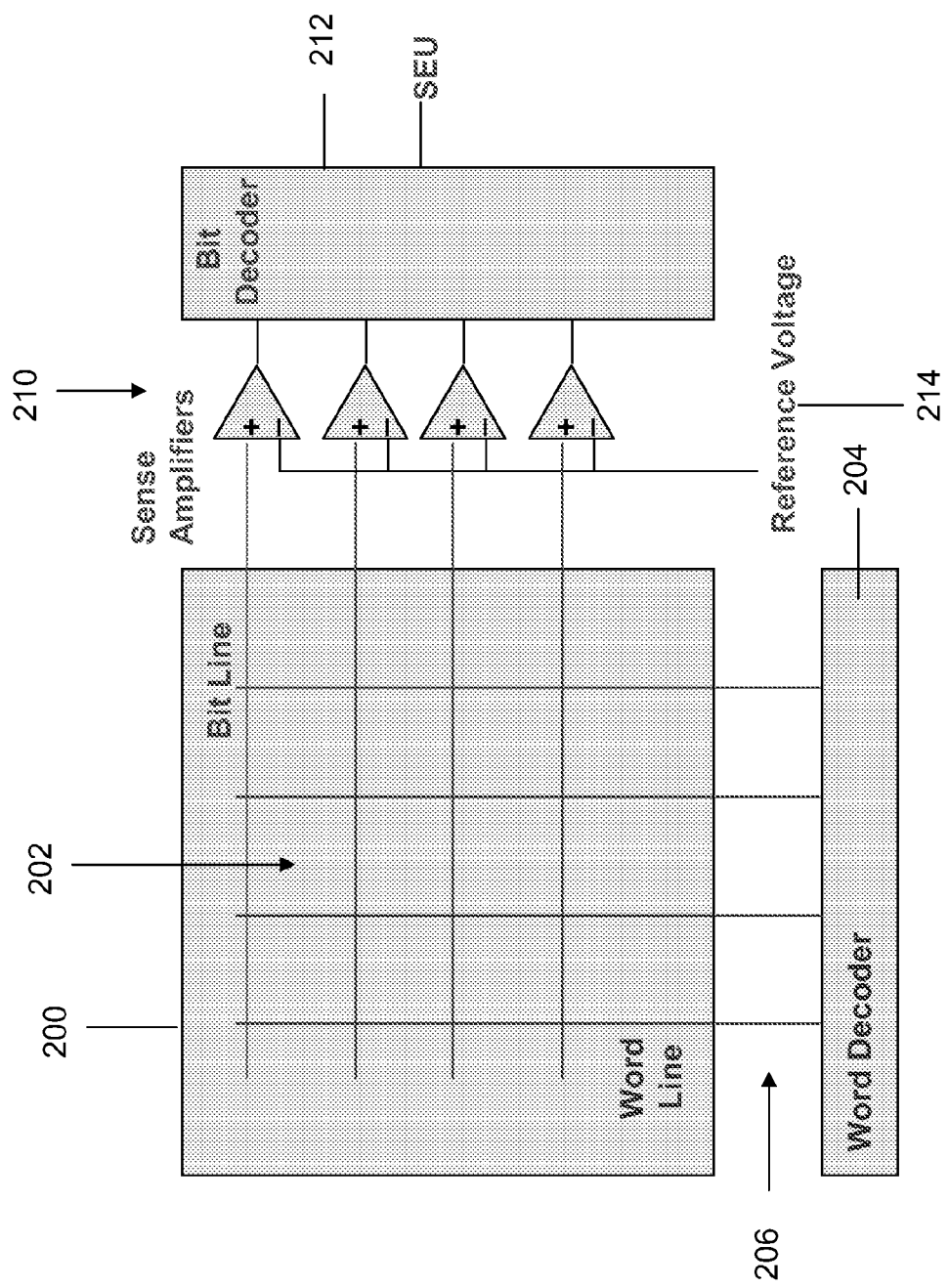
FIG. 2 shows an exemplary DRAM design for accelerated soft-error detection in accordance with an embodiment of the invention.

The accelerated SEU monitor can be implemented in a DRAM array 200, where word decoders 204 are used to drive the word-lines 206, an set (e.g., at least one) of DRAM cells 202 are connected to a set (e.g., at least one) of latch-style sense amplifiers 210, and the outputs of sense amplifiers 210 are multiplexed by bit decoders 212 (FIG. 2). The negative (−) inputs to the sense amplifiers are connected to an adjustable reference voltage generator 214. In normal DRAM operation, this reference voltage is typically centered between the '1' and '0' input levels to provide approximately equal signal levels for each data type. In SED mode, this reference voltage can be programmed higher to reduce the effective critical charge level of a stored '1' in the DRAM cells. When an SEU reduces the stored charge in the DRAM cells, the sense amplifier will detect the event and generate the output as a '0', instead of a '1'. The cells in a DRAM array can be initially set to '1', and SEU is detected when any of the cells is set to '0' based on the reading from the sense amplifier.

Figure 3:
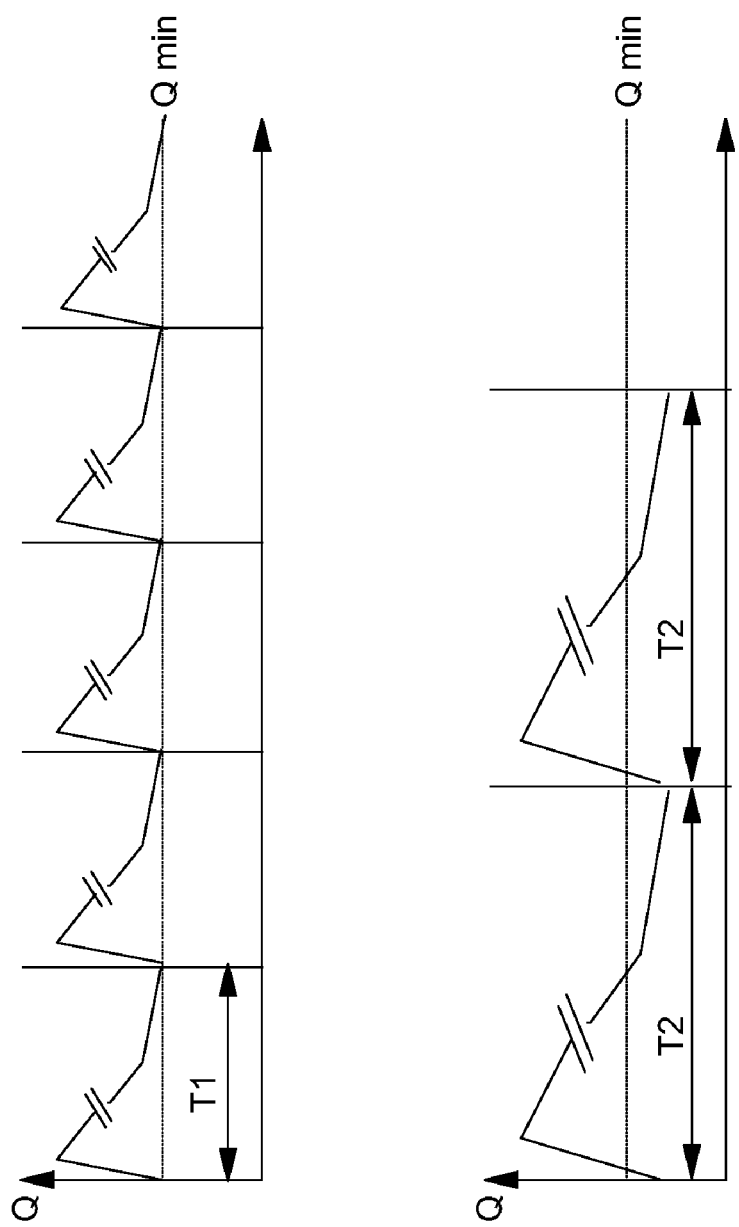
FIG. 3 shows an exemplary approach for adjusting refresh rate to accelerate soft-error detection.

In the second embodiment, a heavy-ion sensing apparatus is implemented in DRAM to accelerate the soft error detection by adjusting the sensing margin and the refresh rate. In order to monitor the radiation-induced soft error, the SER sensitivity of a DRAM array can be increased by adjusting the sensing margin and extending the refresh cycle time during SED mode. In FIG. 3, the refresh cycle time is normally set to T1, so that the charge of each cell can be kept above a minimum level that is determined by the cell structure and process technology. In order for DRAM array to be more susceptible to SEU, the refresh cycle can be extended from T1 to T2, which allows the stored charge to fall below the minimum level before the next refresh cycle. As a result, the minority carriers generated by high-energy particle hits will cause more soft errors in memory cells before the next refresh. The adjustment of sensing margin and refresh rate to increase SER sensitivity can be applied to any ionizing particle, but its effectiveness on a specific particle depends on the particle's linear energy transfer (LET).

The third embodiment of the invention describes the method of sensing heavy ions and accelerating the soft error detection in a DRAM array by lowering the power supply voltage of the DRAM macro during SED mode. For a system-on-a-chip that has multiple power supply voltage levels, a power switch can be used to connect the testing DRAM macros to a lower power supply voltage during SED mode to achieve different levels of sensitivity to detect the soft error rate. For example, during normal mode, the DRAM can be operated at 2.0V, but during the SED mode, it can be operated at 1.5V. By lowering the power supply level, the sensitivity to high-energy particle disturbance can be increased, which in turn accelerates the SER test.

The fourth embodiment of the invention describes the combined use of adjustable refresh rate, power supply voltage, and sensing reference level for accelerated SEU tests, radiation characterization, and simulation model calibrations of a DRAM array. By properly designing the SER monitor, the refresh rate, power supply, and sensing reference level of a DRAM array can be programmed dependently or independently to make the DRAM array more susceptible to radiation. These parameters (refresh rate, power supply and sensor reference level) constitute a multi-dimensional matrix of operating conditions that can be exploited for cost-effective SEU tests, characterization, and model calibration.

II. Experimental Matrix Built From Mono-Energetic Ion Beam Measurements and its Applications (1) Elements of Experimental Parameter Matrix The present invention also uses heavy-ion beams as SEU probes to irradiate the DRAM test arrays, which are designed with adjustable refresh rate, adjustable power supply, and sensor with adjustable reference level. Various high-quality mono-energetic heavy-ion beams are available and cover a wide range of linear energy transfer (LET) values. Since the LET of an ion is quadratically proportional to its charge, and inversely proportional to the square of its velocity, soft errors can be induced with good statistics in a short period time by increasing the intensity of the beam, or the number of particles per unit area, to significantly reduce the long testing time needed during life testing. By changing the beam energy, the bombarding ion species, and sampling circuit orientation with respect to the ion beam, one can tune the LET value and the path length of the ions through sensitive volumes to precisely control the charge deposited in the sensitive volume. Based on the proposed parameter matrix, a statistical database can be created from the measurement to characterize the SEU sensitivity of a DRAM array. These heavy ion tests can be performed cost-effectively for radiation characterization. The SEU sensor can also be used to calibrate predictive simulation models and design tools to provide an easy means of evaluating radiation-induced soft errors caused by heavy ion beams, as well as proton and neutron beams, for microelectronics and aerospace applications.

Figure 4:
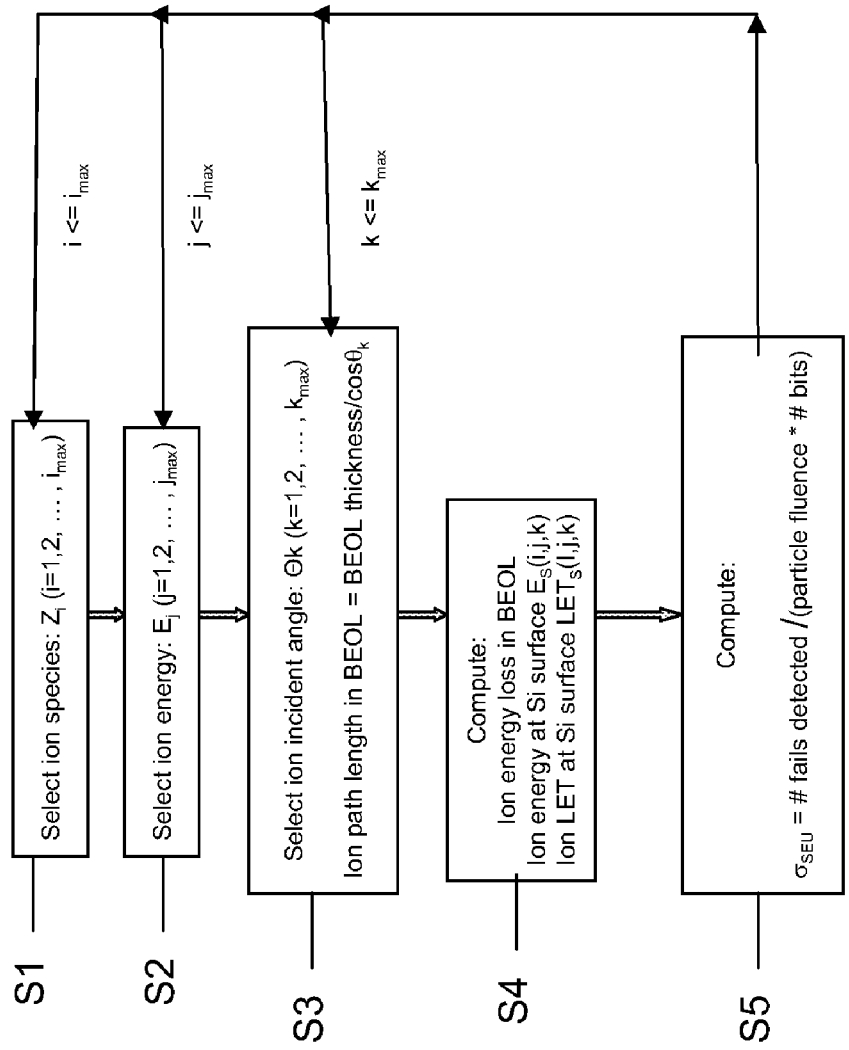
FIG. 4 shows an exemplary flowchart for constructing a parameter matrix from mono-energetic ion beam measurements.

Referring to FIG. 4, a flow chart is depicted that shows steps for the construction of an parameter matrix, derived from mono-energetc ion beam measurements. In Step S1, an ion species $Zi(i=1, 2, \ldots, imax)$ is selected. In step S2, an ion energy $Ej(j=1, 2, \ldots, jmax)$ is selected. In step S3, an ion incident angle $\Theta k(k=1, 2, \ldots, kmax)$ is selected. In one or more additional steps (shown as a single Step S4), an ion energy loss in a BEOL; an ion energy at a Si surface $Es(i,j,k)$; and an ion LET at a Si surface $LETs(l,j,k)$ are computed. In step S5, a measured SEU cross section is computed.

An objective of this method is to obtain a SEU cross section curve, which in turn serves as an intrinsic characterization of SEU sensitivity of the DRAM in question. This SEU cross section curve depends on the operating conditions (e.g., applied voltage), and other properties (e.g., cell geometry, storage capacitance, critical charge, etc.). For many generations of CMOS technologies (bulk as well as SOI), it has been found that, at least to a first order, this curve depends on the effective LET of the ionizing particle (when it hits the surface of the active volume). The SEU cross section, plotted against effective LET, can often be parametrized by a Weibull form. Here, effective LET is defined as the surface LET divided by the cosine of the incident angle. In radiation physics literature, LET is often expressed in units of MeV-cm$^2$/mg. In the present invention, however, it is more convenient to express LET in units of MeV/μm.

The parameters controlled by the experimental setup include: ion charge $Z_i$, energy $E_j$, incident angle $\Theta k$, and particle fluence of the beam. By tilting the test DRAM relative to the particle beam, the incident angle can be changed and hence the path length of the ion through the back end of the sample can be adjusted at will. If the BEOL materials are known, the energy-range relation of the incident ion can be readily and accurately calculated. From this one can compute the LET and energy of the ion at the surface of the active Si region. Also the path length in the active device/charge collection region can be manipulated for model calibration purposes.

Two points are noted:

(A) Charge deposited by the incident ion in the DRAM can be estimated as: 44.5 fC*effective LET on Si surface (in MeV/μm)*path length in charge collection volume (in μm).

Here 1 fC=1E-15 Coulomb of electric charge.

Path length can be estimated from the device and circuit layouts. For higher precision, it can be rigorously computed by Monte Carlo simulations.

(B) The SEU cross section curve (plotted against effective LET) is equivalent to a probability curve. That is, it gives the probability that a random ion, within a certain range of LET, hitting the DRAM, will cause single event upset.

(2) Projection of Alpha-Induced SEU Rate

Simulation methods are available with which one models the emission of alpha particles and transport through IC materials. Hence one can simulate the energy or LET distributions of these alphas as they hit the active node.

Combining such simulations, and measure alpha-induced SEU cross section, one can estimate the soft fail rate caused by alphas:

$$\text{Alpha-induced soft fail rate} = \int dL\, f(L)\sigma_{SEU}(L). \quad (A.1.1)$$

In (A.1.1), L stands for ion LET; f(L) is the LET distribution extracted from model simulations, and $\sigma_{SEU}(L)$ is the measured SEU cross section.

(3) Projection of Neutron-Induced SEU Rate

The concept of ion-induced SEU cross section described above can be extended to mono-energetic high-energy hadrons: protons, neutrons and pions. However, the underlying physical processes responsible for ion-induced SEUs and hadron-induced SEUs are quite different. Ion-induced SEUs are mainly due to direct ionization of the ion through the semiconductor materials. Proton-, neutron- and pion-induced SEUs are largely due to the secondary particles (H, He, other light ions+heavy recoil nuclei) produced in nuclear spallation reactions. It is convenient to express proton-, neutron- and pion-induced SEU cross section as function of particle energy.

Terrestrial neutrons generated by cosmic rays play a dominant role in SEUs of most commercial electronic components. At high altitude applications and in space programs, high-energy protons are a major component of cosmic ray radiation and cause SEUs. In high-energy physics experiments, very often pions (produced in the experiments) make significant contributions to SEUs.

Combining measured neutron-induced SEU cross section (as function of neutron energy) with neutron energy differential flux, the soft fail rate due to terrestrial neutrons can be computed, as has been discussed in the text.

(4) Calibrations of SEU Models of Device/Circuit with Experimental Hardware

The parameter matrix described above can be exploited to calibrate SEU models at the device and/or circuit levels. Ideally, one can determine the LET threshold by radiating the DRAM with normal incident ion beams. By varying the ion charge and energy, one determines the LET threshold ($LET_{th}$), which can be defined as the value of LET below which the SEU cross section falls to below a few percents of the saturation value of cross section at large LETs. We estimate the critical charge to be:

$$Q_{crit} = 44.5 \text{ fC} * LET_{th}(\text{in MeV}/\mu m) * \text{Active device region path thickness (in } \mu m). \quad (A.1.2)$$

This can be used to calibrate circuit analysis of critical charge.

Measured data from varying orientations of the test sample correspond to different ion paths through the DRAM. They can be exploited to check and calibrate charge collection models derived from rigorous, physics-based device simulations.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A programmable sensing detector for accelerated soft error detection, comprising:
    a diffusion area to collect radiation;
    a pre-charged ballast capacitor coupled to the diffusion area;
    a sense amplifier coupled to the pre-charged ballast capacitor for detecting a Single Event Upset (SEU) based on the radiation collected in the diffusion area; and
    a pre-charge device coupled to the sense amplifier for providing a first voltage to the sense amplifier.

2. The programmable sensing detector of claim 1, the sense amplifier further receiving a second voltage.

3. The programmable sensing detector of claim 2, a radiation sensing level of the sense amplifier being adjustable by tuning the second voltage.

4. A programmable sensing detector for accelerated soft error detection, comprising:
    a diffusion area to collect radiation;
    a pre-charged ballast capacitor coupled to the diffusion area;
    a sense amplifier coupled to the pre-charged ballast capacitor for detecting a Single Event Upset (SEU) based on the radiation collected in the diffusion area; and
    a set of carriers generated by high-LET particles.

5. A programmable sensing detector for accelerated soft error detection, comprising:
    a diffusion area to collect radiation;
    a pre-charged ballast capacitor coupled to the diffusion area; and
    a sense amplifier coupled to the pre-charged ballast capacitor for detecting a Single Event Upset (SEU) based on the radiation collected in the diffusion area,
    wherein a radiation sensing level of the sense amplifier being adjustable by adjusting a sensing margin and a refresh rate of the sense amplifier.

6. A method for Dynamic Random Access Memory (DRAM) soft error detection, comprising:
    initializing a storage node to a first voltage at a predetermined refresh rate;
    detecting, with a sense amplifier coupled to the storage node, a Single Event Upset (SEU) event when the storage node has discharged to a second voltage; and
    generating an output signal from the sense amplifier indicating that the SEU event has occurred,
    wherein a radiation sensing level of the sense amplifier being adjusted by adjusting a sensing margin and a refresh rate of the sense amplifier.

* * * * *